United States Patent
Chen et al.

(10) Patent No.: US 6,867,086 B1
(45) Date of Patent: Mar. 15, 2005

(54) MULTI-STEP DEPOSITION AND ETCH BACK GAP FILL PROCESS

(75) Inventors: David Chen, East Palo Alto, CA (US); Robert A. Shepherd, Jr., Castro Valley, CA (US); Vishal Gauri, San Jose, CA (US); George D. Papasouliotis, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/389,164

(22) Filed: Mar. 13, 2003

(51) Int. Cl.⁷ .................. H01L 21/338; H01L 21/336; H01L 21/76; H01L 21/31; H01L 21/439

(52) U.S. Cl. .................. 438/219; 438/295; 438/404; 438/787; 438/788

(58) Field of Search .................. 438/404, 788, 438/791, 792, 219, 295, 787

(56) References Cited

U.S. PATENT DOCUMENTS

| | | | |
|---|---|---|---|
| 6,030,881 A | 2/2000 | Papasouliotis et al. ...... 438/424 |
| 6,265,269 B1 * | 7/2001 | Chen et al. .................. 438/270 |
| 6,277,764 B1 * | 8/2001 | Shin et al. .................. 438/763 |
| 6,335,261 B1 | 1/2002 | Natzle et al. ............... 438/435 |
| 6,479,396 B1 * | 11/2002 | Xu et al. .................... 438/723 |
| 6,531,377 B2 | 3/2003 | Knorr et al. ................ 438/435 |
| 6,569,777 B1 * | 5/2003 | Hsu et al. ................... 438/725 |
| 2001/0019903 A1 * | 9/2001 | Shufflebotham et al. .... 438/788 |
| 2004/0058549 A1 * | 3/2004 | Ho et al. .................... 438/694 |

* cited by examiner

*Primary Examiner*—William M. Brewster
(74) *Attorney, Agent, or Firm*—Beyer Weaver & Thomas LLP

(57) ABSTRACT

High density plasma chemical vapor deposition and etch back processes that can fill high aspect ratio (typically at least 5:1, for example 6:1), narrow width (typically sub 0.13 micron, for example 0.1 micron or less) gaps with significantly reduced incidence of voids or weak spots are provided. This deposition part of the process may involve the use of any suitable high density plasma chemical vapor deposition (HDP CVD) chemistry. The etch back part of the process involves an integrated multi-step (for example, two-step) procedure including an anisotropic dry etch followed by an isotropic dry etch. The all dry deposition and etch back process in a single tool increases throughput and reduces handling of wafers resulting in more efficient and higher quality gap fill operations.

56 Claims, 8 Drawing Sheets

MULTI-STEP DEPOSITION AND ETCH BACK GAP FILL PROCESS

BACKGROUND OF THE INVENTION

This invention relates to electronic device fabrication processes and associated apparatus. More specifically, the invention relates to chemical vapor deposition and dry etch processes for forming dielectric layers, particularly in high aspect ratio, narrow width recessed features.

It is often necessary in semiconductor processing to fill a high aspect ratio gaps with insulating material. This is the case for shallow trench isolation, inter-metal dielectric layers, passivation layers, etc. As device geometries shrink and thermal budgets are reduced, void-free filling of narrow width, high aspect ratio spaces (e.g., AR>3:1) becomes increasingly difficult due to limitations of existing deposition processes.

Most deposition methods either deposit more material on the upper region than on the lower region of a side-wall or form cusps at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. The most problematic reentrant feature is a narrowing at the top of the gap. Thus, the etched side-walls slope inward near the top of the gap. For a given aspect ratio feature, this increases the ratio of gap volume to gap access area seen by the precursor species during deposition. Hence voids and seams become even more likely.

While some specific gap fill processes such as TEOS/ozone SACVD (sub atmospheric chemical vapor deposition) deposited BPSG provide generally good results, such processes are expiring due to incompatibility with the advanced device constraint of a maximum thermal budget of 700° C.

Going forward, the deposition of silicon dioxide assisted by high-density plasma chemical vapor deposition (HDP CVD)—a directional (bottom-up) CVD process—is the method of choice for high aspect ratio gap fill. The method deposits more material at the bottom of a high aspect ratio structure than on its sidewalls. It accomplishes this by directing charged dielectric precursor species downward, to the bottom of the gap. Thus, HDP CVD is not an entirely diffusion-based (isotropic) process.

Nevertheless, some overhang still results at the entry region of the gap to be filled. This results from the non-directional deposition reactions of neutral species in the plasma reactor and from sputtering/redeposition processes. The directional aspect of the deposition process produces some high momentum charged species that sputter away material. The sputtered material tends to redeposit on the sidewalls. Thus, the formation of overhang cannot be totally eliminated and is inherent to the physics and chemistry of the HDP CVD process. Of course, limitations due to overhang formation become ever more severe as the width of the gap to be filled decreases, the aspect ratio increases, and the features become reentrant.

Dielectric deposition is normally a one step process in semiconductor device fabrication. In some gap fill applications, in particular in the case of small features with high aspect ratios, a multi-step deposition/etch back type of process has been used in order to remove overhang and facilitate void-free gap fill. For example, a deposition and etch process utilizing HDP CVD deposition and an aqueous HF dip for the etch back step has been used. However, this requires that the wafers be cycled between the plasma deposition system and the wet etch back system for up to five cycles. This results in a very inefficient and low throughput (e.g., about 3 wafers per hour (wph)) process for the gap fill.

In situ low pressure, high energy ions (HDP) have been used for anisotropic etch back of HDP CVD deposited dielectric material in order to keep the top of the structures from closing before the gap (trench) is filled. Such in situ HDP CVD deposition and etch back processes are described, for example, in U.S. Pat. Nos. 6,335,261 and 6,030,881.

While these multi-step deposition and etch back processes have improved high aspect ratio gap fill capabilities, dielectric deposition processes that can fill high aspect ratio features of narrow width, particularly very small features (e.g., about 0.1 um gap width) with aspect ratios of about 6:1 or more, without leaving voids, continue to be sought.

SUMMARY OF THE INVENTION

The present invention address this need by providing high density plasma chemical vapor deposition and etch back processes that can fill high aspect ratio (typically at least 5:1, for example 6:1), narrow width (typically sub 0.13 micron, for example 0.1 micron or less) gaps with significantly reduced incidence of voids or weak spots. This deposition part of the process may involve the use of any suitable high density plasma chemical vapor deposition (HDP CVD) chemistry, including those with hydrogen and dopant precursors in the reactive mixture.

The etch back part of the process involves an integrated multi-step (for example, two-step) procedure including an anisotropic dry etch followed by an isotropic dry etch. This etch back part of the process may involve any suitable dry etch techniques, for example a reactive ion etch (RIE) using anisotropic chemistry followed by a downstream plasma etch using isotropic chemistry. Suitable plasma reactors with both radio frequency (RF) and downstream plasma sources are available to accomplish both of these etch techniques.

The avoidance of wet etch chemistry facilitates the combination of both deposition and etch reactors in a single tool. All dry deposition and etch back process in a single tool increases throughput and reduces handling of wafers resulting in more efficient and higher quality gap fill operations.

In one aspect, the invention pertains to a method of filling gaps on a semiconductor substrate. The method involves partially filling a gap on a semiconductor substrate with dielectric using a high density plasma chemical vapor deposition process, partially removing dielectric deposited in the gap from the gap opening and sidewalls by a multi-step etch back process comprising an anisotropic dry etch followed by an isotropic dry etch, and further filling of the partially filled gap by HDP CVD.

In another aspect, the invention pertains to a method of cleaning a partially filled gap on a semiconductor substrate. The method involves partially removing dielectric deposited in the gap from the gap opening and sidewalls by a multi-step etch back process comprising an anisotropic dry etch followed by an isotropic dry etch.

In preferred embodiments of the invention the multi-step etch process involves a reactive ion etch followed by a downstream plasma etch.

These and other features and advantages of the present invention are described below where reference to the drawings is made.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention relates to chemical vapor deposition and etch back processes that can fill high aspect ratio (typically at least 5:1, for example 6:1), narrow width (typically sub 0.13 micron, for example 0.1 micron or less) gaps with significantly reduced incidence of voids or weak spots. This deposition part of the process may involve the use of any suitable high density plasma chemical vapor deposition (HDP CVD) chemistry, including those with hydrogen and dopant precursors in the reactive mixture. Generally, a high density plasma is any plasma having electron density of $1 \times 10^{12}$ electrons per cubic centimeter. Typically, though not necessarily, high density plasma reactors operate at relatively low pressures, in the range of 100 mTorr or lower.

The etch back part of the process involves an integrated multi-step (for example, two-step) procedure including an anisotropic dry etch followed by an isotropic dry etch. This etch back part of the process may involve any suitable dry etch techniques, for example a reactive ion etch (RIE), using anisotropic chemistry followed by a downstream plasma etch, for example microwave or inductively coupled plasma (ICP), using isotropic chemistry. Suitable plasma reactors with both radio frequency (RF) and downstream plasma sources are available to accomplish both of these etch techniques.

The avoidance of wet etch chemistry facilitates the combination of both deposition and etch reactors in a single tool. All dry deposition and etch back process in a single tool increases throughput and reduces handling of wafers resulting in more efficient and higher quality gap fill operations.

Multi-Step Deposition and Etch Back Process

Figure 1A:
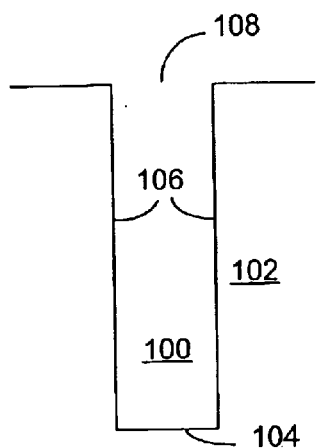
FIGS. 1A–E depict rough schematic cross-sectional diagrams of a multi-step gap fill process in accordance with the present invention.

FIGS. 1A–E depict rough schematic cross-sectional diagrams of a multi-step deposition and etch back gap fill process in accordance with the present invention. FIG. 1A depicts a trench (gap) 100 on a semiconductor substrate 102 requiring filling with a dielectric. The gap may be defined by its features, namely its bottom 104, sidewalls 106 and entry region (top) 108. The gap 100 is generally lined with a barrier layer, such as silicon nitride. As such, a thin layer (e.g., 10–200 Å, for example 100 Å) of silicon nitride is formed on the gap bottom 104 and sidewalls 106 prior to being filled with dielectric. A pad nitride also generally exists at the entry region 108, on the substrate surface surrounding the gap 100.

The present invention, while applicable to the filling of any gap requiring dielectric fill, is particularly suited to gap fill of high aspect ratio, narrow width gaps. For example, the gap 100 may have a high aspect ratio, for example about 6:1 and a narrow width, for example about 1000 Å.

Figure 1B:
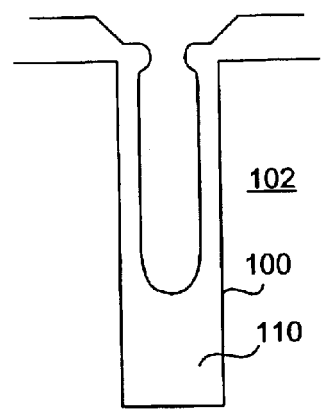

In an initial step in a multi-step gap fill process in accordance with the present invention, the gap 100 is partially filled with a dielectric 110 deposited by high density plasma (HDP) chemical vapor deposition (CVD) process, as shown in FIG. 1B. Generally, a high density plasma is any plasma having electron density of at least about $1 \times 10^{12}$ electrons per cubic centimeter. Typically, though not necessarily, high density plasma reactors operate at relatively low pressures, in the range of 100 mTorr or lower. The HDP CVD deposition results in beneficial filling of the trench from the bottom 104 up. However, as described above, there is still some problematic top and sidewall deposition resulting in an overhang 112 at the entry region 108 of the gap 100 and a further narrowing of the unfilled portion of the gap, respectively. As noted above, this results from the non-directional deposition reactions of neutral species in the plasma reactor and from sputtering/redeposition processes. Limitations due to overhang formation become ever more severe as the width of the gap to be filled decreases, the aspect ratio increases, and the features become reentrant.

Any suitable deposition chemistry may be used. In general, an HDP CVD process gas will include a precursor for the deposition layer. If the dielectric is a silicon-containing dielectric, then the process gas will include a silicon-bearing compound such as silane. The process gas will also generally include a carrier gas. The carrier gas may be an inert gas, such as He and/or other noble gases. Or the carrier gas may be or include elemental or molecular hydrogen. Oxygen to form the silicon oxide or other dielectric material may be provided by the silicon-containing precursor itself or from another process gas such as elemental oxygen ($O_2$), nitric oxide (NO), and/or nitrous oxide ($N_2O$).

The deposition process gas will have a particular composition represented by flow rates of the constituent gases in units of standard cubic centimeter per minute (sccm). The process gas will include a precursor for the deposition layer. If the dielectric is a silicon-containing dielectric, then the process gas will include a silicon-bearing compound such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

The process gas will also generally include a carrier gas. The carrier gas may be an inert gas, such as He and/or other noble gases. Or the carrier gas may be or include elemental or molecular hydrogen.

Oxygen to form the silicon oxide or other dielectric material may be provided by the silicon-containing precursor itself or from another process gas such as elemental oxygen ($O_2$), nitric oxide (NO), and/or nitrous oxide ($N_2O$).

Typical flow rate ranges for process gases of the present invention are listed below.

| Gas | Flow Rate (sccm) |
| --- | --- |
| $SiH_4$ | 10–300 |
| $O_2$ | 20–1000 |
| He | 0–500 |
| $H_2$ | 0–5000 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 150 sccm.

Note also that the presence of hydrogen in the process gas may require that the ratio of oxygen containing precursor to silicon-containing precursor be adjusted upward (in comparison to a standard hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 200 sccm, and more preferably at least about 400 sccm, and most preferably at least about 500 sccm—all based on a 200 millimeter substrate. Larger substrates require higher flow rates. The flow rate may vary somewhat when special injector configurations are employed.

The invention is also practiced with process gases containing noble gas (e.g., argon, helium, or xenon), with helium being preferred, either as the sole carrier gas, or in a mixture with hydrogen. The use of noble gases can be practiced under the conditions of the above-described embodiments, and their flow rate can be used in order to modulate the effect of other process gas components (e.g., hydrogen) on the deposition profile of the deposited oxide film.

For doped dielectrics (particularly silicon dioxide based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, NO, $N_2O$, and mixtures thereof.

The method applies as well to the deposition (biased or unbiased) of carbon-doped silicon oxide from process gas mixtures including organosilanes (e.g., TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof).

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 450° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the upper electrode (for generating the plasma) typically varies from 1 kW to 20 kW, and the high frequency power (for biasing the wafer) typically reaches at least about 0.2 W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

In a preferred embodiment, the deposition process chemistry is as follows:

| Gas | Flow Rate (sccm) |
|---|---|
| $SiH_4$ | 40 |
| $H_2$ | 1000 |
| $O_2$ | 75 |

The low frequency electrode is powered at 3000 W and the high frequency electrode is powered at 2600 W. Further details of suitable HDP CVD deposition process gas chemistries are provided below.

The deposition conditions may be selected to optimize deposition topography. Of particular interest are bottom-up fill, uniformity of sidewall deposition, and protection of the pad nitride at the top of the gap structure. The deposition topography can be optimized by manipulating the S/D ratio of the deposition process. S/D ratio refers to the sputter/deposition ratio. It is obtained by measuring the deposition rate for a given dielectric deposition process and then measuring the sputter rate for that same process performed without the silicon-containing precursor (e.g., silane). The S/D ratio is given by the following expression:

$S/D$=sputter rate/(sputter rate+deposition rate).

Optimization of deposition conditions to optimize dielectric topography for the inventive process is described in further detail with reference to FIGS. 6A and B below.

The conditions are preferably set so that the isotropic etch is selective for the HDP CVD deposited dielectric (e.g., $SiO_2$) relative to the silicon nitride barrier layer lining the trench. Adjustment of the process selectivity is within the skill in the art given the process parameters and description provided herein. The process selectivity can be controlled at least up to 1.4:1 (USG: silicon nitride).

Following this initial deposition step, the detrimental top and sidewall deposition is removed in a multi-step (e.g., two-step) etch back process to facilitate further void free filling of the trench. In a preferred embodiment, a two-step etch back process is carried out in a separate reactor chamber with a significantly different operation regime (e.g., a pressure range of 0.2 to 3 torr) than the deposition chamber.

Figure 1C:
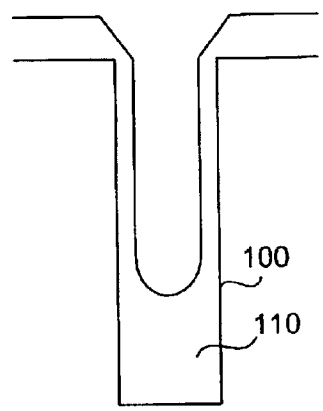

In a first step of the etch back process, the wafer is processed under anisotropic conditions. In this step, the top surface of the deposited dielectric 110 is etched preferentially with minimal removal of any dielectric from the bottom and sidewalls of the gap 100, for example using a reactive ion etch (RIE) with fluorine chemistries. This top and sidewall characteristic is believed to be due to the relatively high process pressure and the directionality of the etch, respectively. Note that this invention is not limited to any particular mechanism of deposition or etch back action. This first etch back step has been shown to reduce the constriction at the top of the gap 100, as illustrated in FIG. 1C.

In a specific embodiment, the first etch step is an anisotropic process that utilizes higher process pressures and lower process power than the deposition process. For example, an RIE configured reactor with low power (e.g., about 100 to 1000 W, for example, 500 W), a biased chuck, a process pressure of about 200–800 mTorr and a $CF_4$-based chemistry may be used. While He/$CF_4$-based chemistry is preferred in one embodiment of the invention, the anisotropic etch step can be realized using other F-bearing compounds (e.g., $C_2F_6$, $CHF_3$, $NF_3$, $SF_6$, etc.) and inert gases (e.g., Ar, $N_2$). Typical process parameter ranges for the RIE etch process gases of the present invention and reactor conditions are listed below.

| | |
|---|---|
| Platen temp (° C.) | 10–60 |
| $CF_4$ (sccm) | 20–100 |
| He (sccm) | 50–200 |
| Pressure (mTorr) | 150–500 |
| RF Power (W) | 100–1000 |
| Time (s) | 10–120 |

In a preferred embodiment, the anisotropic etch process chemistry is as follows:

| | |
|---|---|
| Platen temp (° C.) | 20 |
| $CF_4$ (sccm) | 50 |
| He (sccm) | 150 |
| Pressure (mTorr) | 200–220 |
| RF Power (W) | 450 |
| Time (s) | 40 |

The parameter values above are in reference to a 200 mm chamber. The process can be implemented in a 300 mm chamber as well. In that case, the flows need to be scaled-up accordingly. This first step of the two-step dry etch process reduces the exaggerated constriction at the top of gap following deposition and can be controlled so as not to expose underlying layers of silicon nitride and silicon.

Figure 1D:
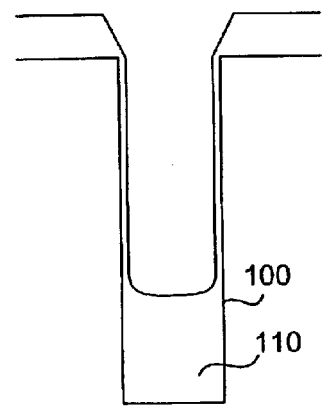

In the second step of the etch back process, the wafer is processed under isotropic conditions. For example, the wafer is exposed to a downstream plasma flow containing fluorine chemistries. This step removes the dielectric isotropically from the gap 100 resulting in widening of the gap, thus reducing the aspect ratio of the partially filled gap, as illustrated in FIG. 1D, and facilitating further filling of the gap by subsequent HDP CVD dielectric deposition.

The second etch step is an isotropic process that utilizes higher process pressures than the first etch step. For example, a microwave downstream plasma configured reactor with 2 KW power (e.g., about 1000 to 2000 W, for example, 1700 W), an unbiased chuck, a process pressure of about 1–3 Torr and an $NF_3$-based chemistry may be used. While He/$NF_3$-based chemistry is preferred in one embodiment of the invention, the isotropic etch step can be realized using other F-bearing compounds (e.g., $C_2F_6$, $CF_4$, $SF_6$, etc) and inert gases (e.g., Ar, $N_2$). Typical process parameter ranges for microwave downstream etch process gases in accordance with the present invention and reactor conditions are listed below.

| | |
|---|---|
| Platen temp (° C.) | 10–60 |
| NF$_3$ (sccm) | 200–1000 |
| He (sccm) | 500–2500 |
| Pressure (Torr) | 1–3 |
| MW Power (W) | 1000–2000 |
| Time (s) | 5–50 |

In a preferred embodiment, the isotropic etch process chemistry is as follows:

| | |
|---|---|
| Platen temp (° C.) | 20 |
| NF$_3$ (sccm) | 750 |
| He (sccm) | 1250 |
| Pressure (Torr) | 2 |
| MW Power (W) | 1700 |
| Time (s) | 15 |

The conditions are preferably set so that the isotropic etch is selective for the HDP CVD deposited dielectric (e.g., SiO$_2$) relative to the silicon nitride barrier layer lining the trench. Adjustment of the process selectivity is within the skill in the art given the process parameters and description provided herein. The process selectivity can be controlled at least up to 1.4:1 (USG: silicon nitride). The parameter values above are in reference to a 200 mm chamber. The process can be implemented in a 300 mm chamber as well. In that case, the flows need to be scaled-up accordingly.

The second step of the two-step dry etch process removes oxide from sidewalls and opens the gap for access of deposition ions to fill the gap from the bottom up in a subsequent HDP deposition.

Figure 1E:
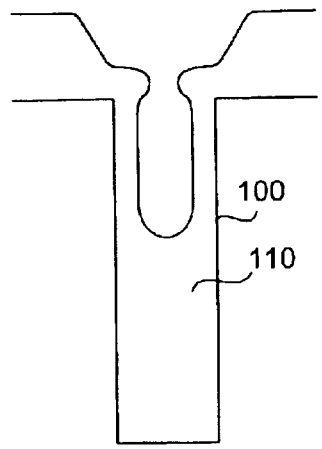

Following the multi-step etch back, an additional HDP CVD deposition is performed in order to further fill the gap 100 with dielectric 110, as shown in FIG. 1E. The etch back and deposition steps depicted in FIGS. 1C–E are then repeated until the gap is filled. For a gap with about a 6:1 aspect ration and about a 1000 Å width, three to five, for example four, iterations of the etch back and deposition steps are typical to obtain void free filling of the gap.

Implementation: Plasma Processing Systems

Figure 2:
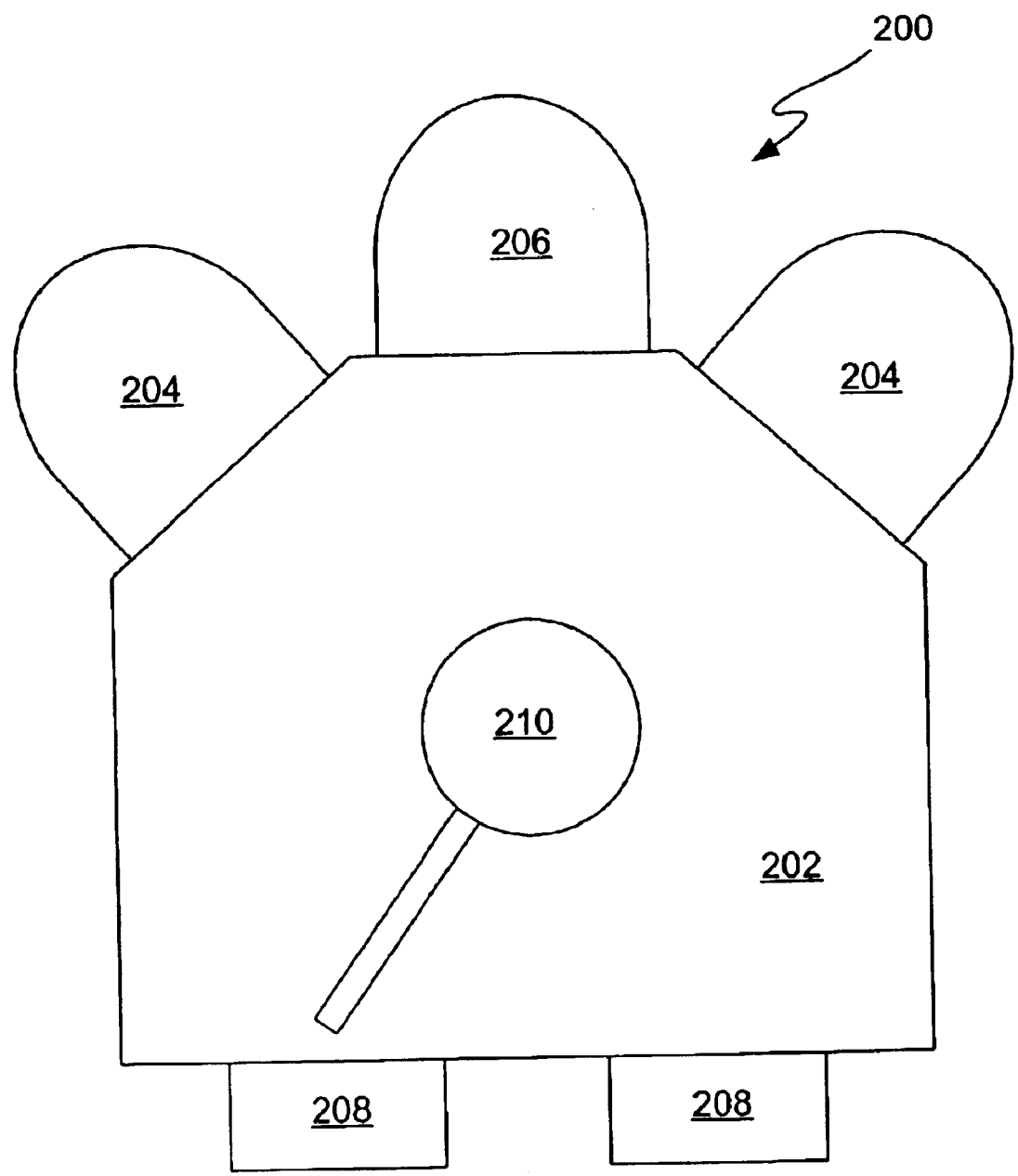
FIG. 2 is a block diagram of a plasma processing system suitable for conducting a multi-step gap fill process in accordance with the present invention.

FIG. 2 is a block diagram of a plasma processing system suitable for conducting a multi-step gap fill process in accordance with the present invention on semiconductor wafers. The system 200 includes a transfer module 202, such as the SPEED deposition platform available from Novellus Systems, Inc. of San Jose, Calif. The transfer module 202 provides a clean, pressurized environment to minimize the risk of contamination of substrates being processed as they are moved between the various processing stages. Mounted on the transfer module 202 are one or more (in this case two) HDP CVD deposition modules 204, such as Novellus SPEED reactors, available from Novellus Systems, Inc. or the Ultima reactors, available from Applied Materials, Inc. of Santa Clara, Calif., and one or more (in this case one) dry etch module 206, such as a Novellus PEP IRIDIA DL strip and clean plasma reactor. The system 200 also includes one or more (in this case two) wafer source modules 208 mounted on the transfer module 202 where wafers are stored before and after gap fill processing. A device (generally a robot arm unit) 210 in the transfer module 202 handles the wafers and moves them among the deposition 204, etch back 206 and storage 208 modules mounted on the transfer module 202.

Briefly, wafers from the wafer sources 208 are transferred by the robot arm 210 between the HDP CVD deposition reactors 204 and the dry etch reactor 206 for deposition and etch back processing, respectively. In a preferred embodiment, a single IRIDIA module can support two SPEED deposition modules in this application with a high throughput of about 15–16 wafers per hour (wph).

It should also be understood that, in an alternative embodiment, the present invention may also be practiced in a single chamber equipped for both plasma deposition and multi-step anisotropic/isotropic dry etch. Given the details and parameters provided herein, one of skill in the art would know how to configure a single chamber, for example, a plasma reactor, with equipment, for example the various plasma sources described herein, for deposition (HDP CVD), anisotropic etch (e.g., RF source for RIE) and isotropic etch (e.g., downstream plasma source such a microwave plasma or ICP).

Various plasma reactor designs are suitable for use with this invention. The particular design is not critical to this invention. It merely needs to support HDP CVD dielectric layer formation on appropriate substrates. Examples of suitable reactors include the Novellus SPEED reactor, available from Novellus Systems, Inc., of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes to generate a plasma and a bias source for the substrate. A temperature control system is typically used to heat the substrate.

Figure 3:
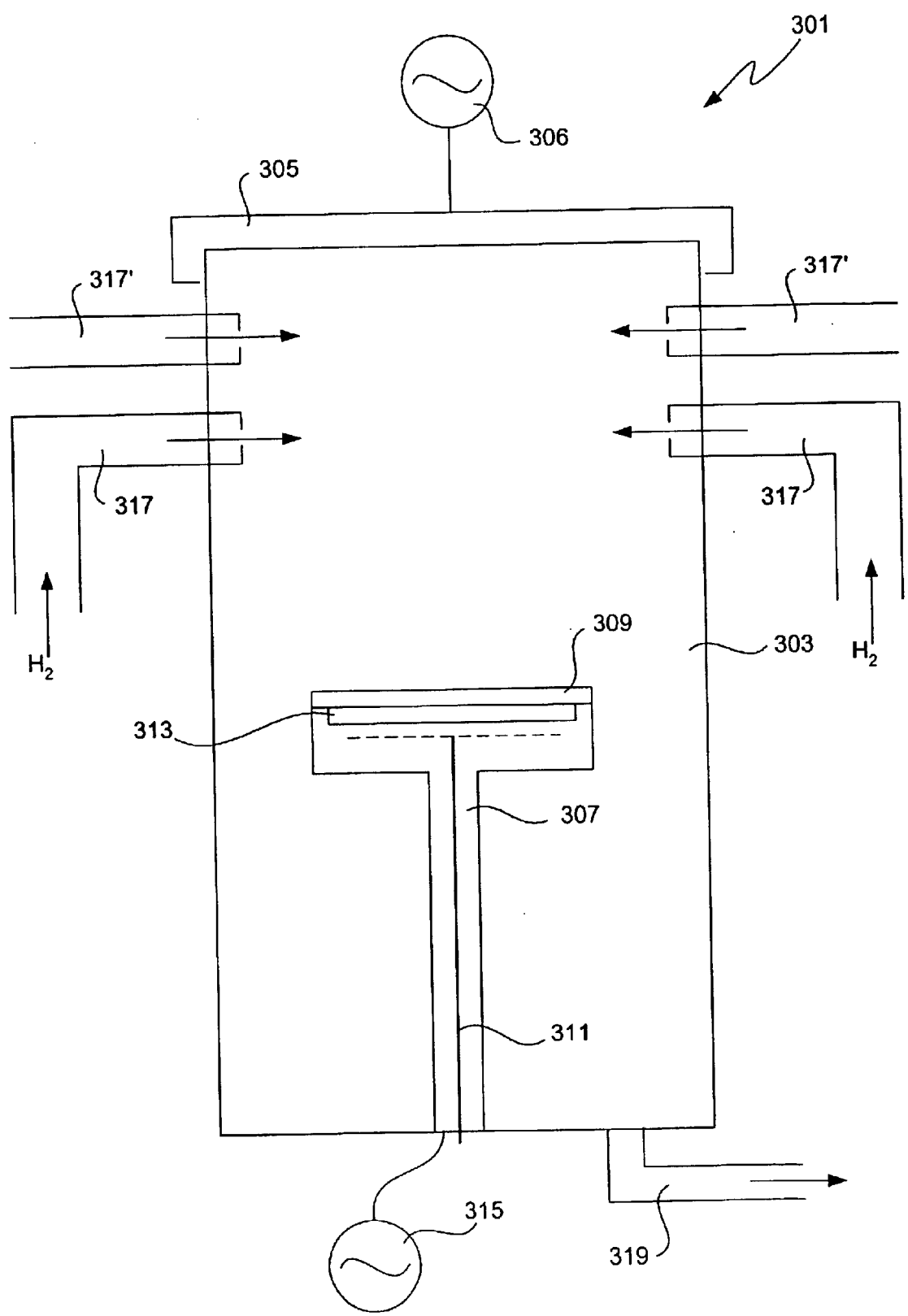
FIG. 3 is a block diagram depicting some components of a suitable CVD reactor for performing HDP CVD in accordance with this invention.

FIG. 3 is a block diagram depicting some components of a suitable CVD reactor for performing HDP CVD in accordance with this invention. As shown, a reactor 301 includes a process chamber 303 which encloses other components of the reactor and serves to contain the plasma generated by an electrode 305. In one example, the process chamber walls are made from aluminum, aluminum oxide, and/or other suitable material. Electrode 305 is powered by a "low frequency" radio frequency (RF) source 306. The power and frequency supplied by source 306 is sufficient to generate high-density plasma from the process gas.

Within the reactor, a wafer pedestal 307 supports a substrate 309. The pedestal typically includes a chuck to hold the substrate in place during the deposition reaction. The chuck may be an electrostatic chuck, a mechanical chuck or various other types of chuck as are available for use in the industry and/or research.

A heat transfer subsystem including a line 311 for supplying a heat transfer fluid controls the temperature of substrate 309. In some embodiments, the heat transfer fluid comprises at least one of helium and argon gas. Water or other liquid is used in other embodiments. The heat transfer fluid is supplied to a space 313 between the surface of the substrate and a surface of the chuck.

A "high frequency" RF source 315 serves to electrically bias substrate 309 and draw charged precursor species onto the substrate for the deposition reaction. Electrical energy from source 315 is coupled to substrate 309 via an electrode or capacitive coupling, for example. Note that the bias applied to the substrate need not be an RF bias. Other frequencies and DC bias may be used as well. In a specific embodiment, source 315 supplies a radio frequency bias to the substrate, and the radio frequency bias is generated by supplying the electrode with at least 0.2 W/cm$^2$ of power.

The process gases are introduced via one or more inlets 317 and 317'. The gases may be premixed or not. In this embodiment, a source of elemental hydrogen gas provides hydrogen for the process gas. Other sources of precursor gases and carrier gases may also be provided. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixture may be introduced from a primary gas ring, which may or may not direct the gas toward the substrate surface. Injectors may be connected to the primary gas ring to direct at least some of the gas or gas mixture into the chamber and toward substrate. Note that injectors, gas rings or other mechanisms for directing process gas toward the wafer are not critical to this invention. The sonic front caused by the gas entering the chamber will itself cause the gas to rapidly disperse in all directions—including toward the substrate.

The process gas exits chamber 303 via an outlet 319. A vacuum pump (e.g., a turbomolecular pump) typically draws the gas out and maintains a suitably low pressure within the reactor.

As with the deposition reactor, various plasma etch reactor designs are suitable for use with this invention, and the particular design is not critical to this invention. It merely needs to support the required anisotropic and isotropic etch functions. Moreover, while a dual source reactor is preferred for quality and efficiency purposes as it minimizes handling of the substrate, more than one reactor may also be used. An example of a suitable dual source reactor is the Novellus PEP IRIDIA DL strip and clean plasma reactor.

The principal components of most suitable reactors include a downstream plasma source, a process gas delivery system, a process chamber, a support for the substrate within the process chamber, one or more electrodes to generate a plasma and a bias source for the substrate within the process chamber. A temperature control system is typically used to control the temperature of the substrate.

Figure 4:
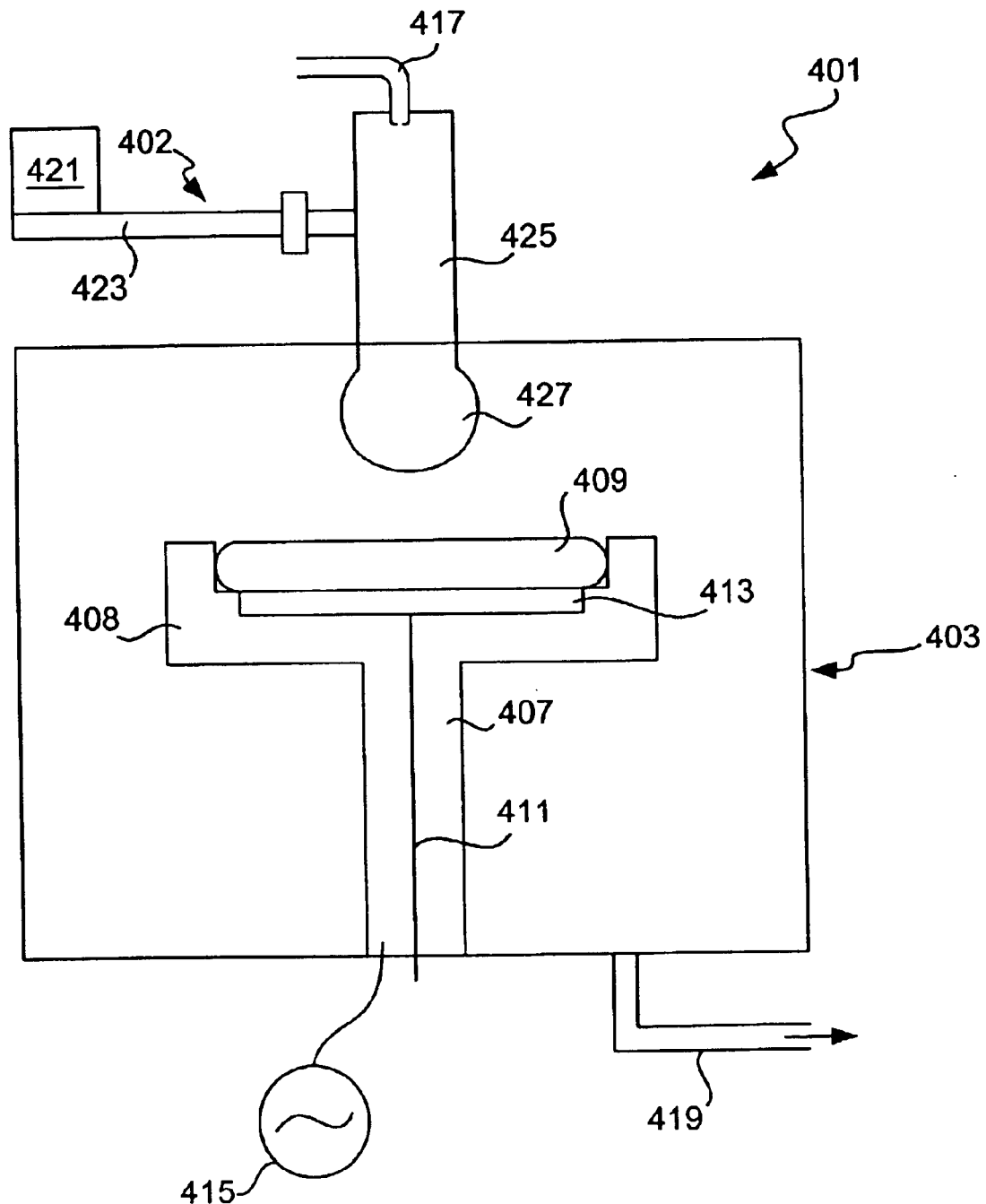
FIG. 4 is a block diagram depicting some components of a suitable dual source RF/microwave plasma reactor for performing etch back in accordance with an embodiment of this invention.

FIG. 4 is a block diagram depicting some components of a suitable dual source RF/microwave plasma reactor for performing etch back in accordance with this invention. As shown, a reactor 401 includes a microwave downstream plasma source 402 and a process chamber 403 which encloses other components of the reactor and serves to contain the plasma generated by an RF power source to the pedestal 407. In one example, the process chamber walls are made from aluminum.

Within the process chamber, a wafer pedestal 407 supports a substrate 409. The pedestal typically includes a chuck 408 to hold the substrate in place during the deposition reaction. The chuck 408 may be an electrostatic chuck, a mechanical chuck or various other types of chuck as are available for use in the industry and/or research.

A heat transfer subsystem including lines 411 for supplying a heat transfer fluid to the pedestal 407 controls the temperature of pedestal 407. In some embodiments, the heat transfer fluid comprises water or another liquid. The etchant process gases are introduced into the reactor at plasma tube 425 in the microwave downstream plasma source 402 via inlet 417. The process gases pass through the microwave downstream plasma tube 425 and are introduced into the process chamber 403. A showerhead 427 may be used to distribute the gas flow uniformly in the process reactor. Microwave power, generated by a magnetron 421 and transmitted to the remote plasma tube via a waveguide 423 may, or may not, be applied to the gases to generate a plasma prior to the gases introduction into the process chamber. Typically, for anisotropic etching, the microwave power is not turned on while the RF plasma is used in the process chamber to effect the directional anisotropic etch. In the case of isotropic etching, the microwave power is applied to generate the plasma, while the RF is typically turned off in the process chamber to effect a purely chemical isotropic etch. But, in some instances, both sources may be used simultaneously for either the anisotropic and/or the isotropic etch steps. The gases may be premixed or not. Preferably, the process gas is introduced through a gas supply inlet mechanism including orifices.

For anisotropic etching, the chamber operates in RIE mode. A "high frequency" RF source 415 serves to electrically generate a plasma, bias the substrate 409 and draw charged precursor species onto the substrate for the anisotropic etch reaction. Electrical energy from source 415 is coupled to substrate 409 via the pedestal 413 which acts as the cathode. The grounded process chamber walls act as the anode. In a specific embodiment, source 415 supplies a radio frequency bias to the substrate, and the radio frequency bias is generated by supplying the electrode with at least 0.32 W/cm$^2$ of power.

For isotropic etching, the reactor operates in microwave downstream plasma mode. Microwave power generates plasma in the plasma tube 425. The reactive gases generated from the plasma are transmitted to the process chamber 403 through a showerhead 427, generally spherical in shape, which distributes the reactive gases uniformly in the chamber, including on the substrate. The reactive gases generated are composed primarily of radicals (neutral species) and some ions. The ions in the reactive gases recombine on the tube and showerhead walls leaving the neutral reactive species to chemically etch the substrate isotropically. In a specific embodiment, the magnetron 421 supplies at least 1000 watts of microwave power to the plasma. The process gas exits chamber 403 via an outlet 419. A vacuum pump (e.g., a turbomolecular pump) typically draws the gas out and maintains a suitably low pressure within the reactor. As an alternative to microwave, an ICP etch may be used as the downstream isotropic etch.

The foregoing describes implementation of the present invention in a multi-chamber.

Process Parameters

Figure 5:
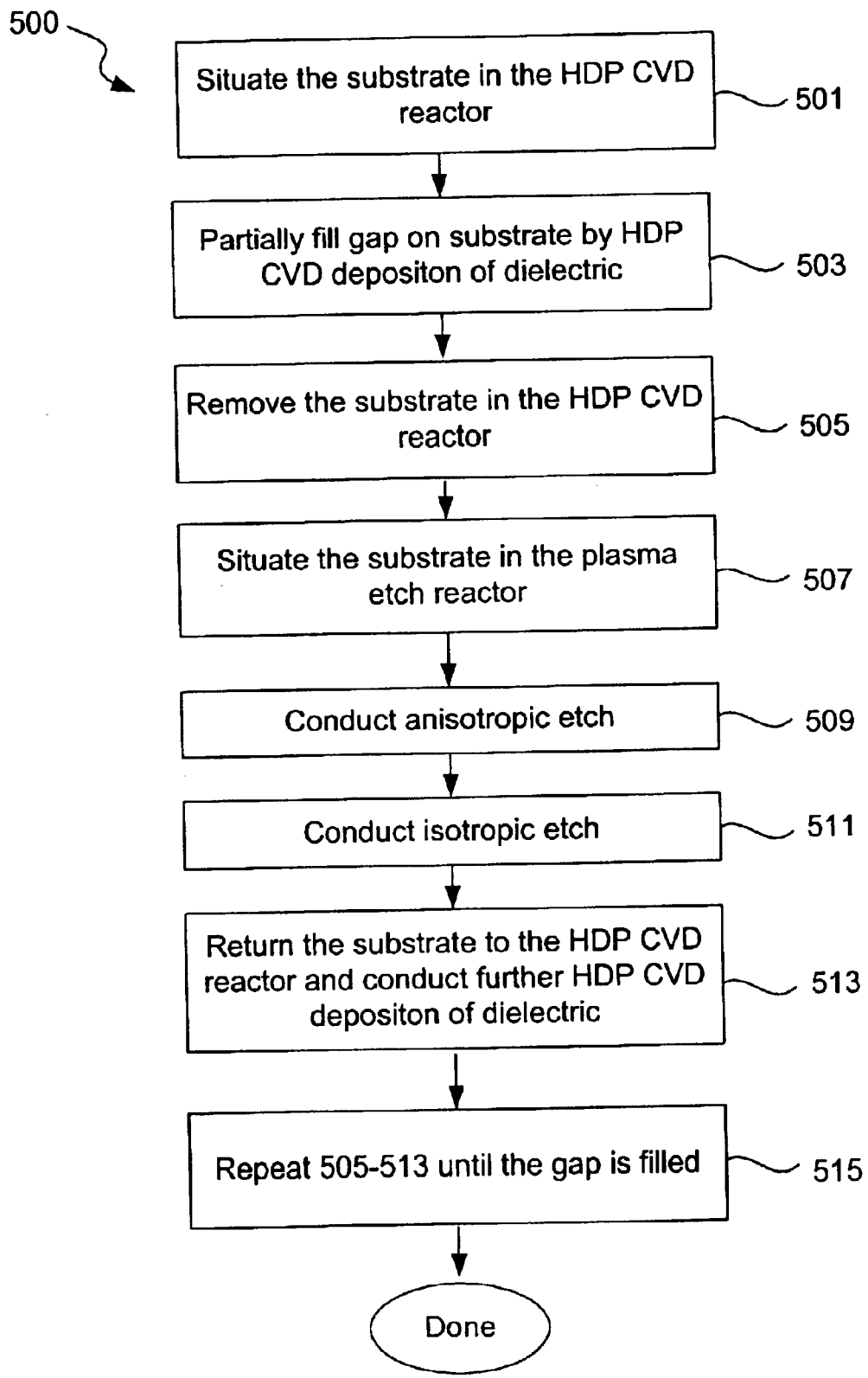
FIG. 5 is a process flow diagram depicting a process context of the present invention.

FIG. 5 is a process flow diagram (500) depicting a process context of the present invention. Reference is made to the system depicted in FIG. 2 throughout the description of this process flow as a sample context for implementation of the invention. A substrate requiring gap filling, such as a semiconductor wafer, is situated in an HDP CVD reactor (501). For example, the robot arm unit 210 picks substrates (wafers) from the wafer sources 208 and places them in the HDP CVD deposition reactors 204.

A deposition process begins with an electrical subsystem applying electrical energy of appropriate power and frequency to one or more electrodes of a process chamber of the reactor. The power and frequency are chosen to generate a high density plasma in the chamber, given the process gas concentration, pressure, and other process parameters. Providing the substrate to the reactor may involve clamping the substrate to a pedestal or other support in the chamber. For this purpose, an electrostatic or mechanical chuck may be employed.

After the wafer is appropriately situated in the chamber, a gap on the substrate is partially filled by HDP CVD deposition of dielectric (503). Several operations are typically performed in the deposition reactor as part of this dielectric deposition process. Generally, the process provides a preclean operation. This is intended to remove polymer or other residues in the gap prior to the dielectric film growing. Preferably, this is accomplished with a plasma phase reaction of at least one of an oxygen-containing gas and a hydrogen-containing gas. Oxygen is used for species that require oxidation and hydrogen is used for species that require reduction. After the substrate has been appropriately cleaned, various other operations associated with dielectric deposition are performed. These operations may be performed sequentially in the order described or in some other order. In addition, some or all of these operations may be performed concurrently, as they are implemented by different subsystems of the reactor.

The process adjusts the substrate temperature to a level promoting the deposition of the dielectric layer. Typically, this temperature is between about 30–1000° C. (more preferably about 300 to 680° C., for example 450–550° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation.

The process adjusts the pressure of the process chamber to a level suitable for the HDP CVD reaction. In some specific embodiments, this pressure is not greater than about 100 mTorr. The pressure should allow relatively rapid deposition while maintaining a high density plasma under the applied frequency and power.

The reactor system introduces a process gas to the reaction chamber via an inlet. The process gas includes dielectric precursor species such as high vapor pressure silicon-containing compounds, and optionally one or more dopant precursors, such as the phosphorus precursor phosphine ($PH_3$). Molecular oxygen or another oxygenated compound will often be present. A carrier gas is also generally present. The carrier gas may be an inert carrier gas such as helium. However, in high aspect ratio gap fill applications the carrier gas preferably is or includes molecular or elemental hydrogen which inhibits precursor dissociation and promotes bottom-up gap fill. All the process gas components are introduced at specified flow rates.

An electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency RF bias and the other electrode is powered by a lower frequency RF source.

Dielectric is deposited in the gap or gaps on the substrate to a desired thickness, generally at the point where the overhang that forms at the gap entry point prevents further effective filling of the gap (503).

After evacuating the chamber and adjusting the temperature and pressure as appropriate, the substrate may be removed from the HDP CVD reactor for further processing (505). The substrate with partially filled gap(s) is then situated in a plasma etch reactor (507). For example, the robot arm 210 removes the substrate from an HDP CVD reactor 204 and transfers it to the dry plasma etch reactor 206 for etch back processing.

As noted above, a multi-step etch back process in accordance with the present invention is preferably implemented in a single dual source plasma reactor. An etch back process begins with an anisotropic etch (509). In a preferred embodiment, the anisotropic etch is conducted using the RF source of the dual source reactor. An electrical subsystem applies electrical energy of appropriate power to one or more electrodes of a process chamber of the reactor. The power and frequency are chosen to generate a reactive ion etch plasma in the chamber, given the etchant chemistry, pressure, and other process parameters. Providing the substrate to the reactor may involve, but not require clamping the substrate to a pedestal or other support in the chamber. For this purpose, an electrostatic or mechanical chuck may be employed.

After the wafer is appropriately situated in the chamber, the process adjusts the substrate temperature to a level promoting the RIE removal of the dielectric overhang deposited in the gap entry region. Typically, this temperature is between about 10–60° C. (more preferably about 10 to 30° C., for example 20° C.). The process also adjusts the pressure of the process chamber to a level suitable for RIE. This pressure is generally about 200–800 mTorr.

The reactor system introduces anisotropic etchant chemistry to the reaction chamber via an inlet. The etchant process gas should dissociate quickly (for optimum directionality) and provide for a volatile etch product that can be removed from the system without it redepositing on the substrate. A $CF_4$/He-based chemistry is typically used. Other fluorinated gases, e.g., $SF_6$ or $NF_3$ may be used. Molecular oxygen and/or one or more an inert carrier gases such as helium or Argon may also be present in the etchant chemistry. All the process gas components are introduced at specified flow rates, within the parameters noted above.

An electrical subsystem applies an RF bias to the substrate, to thereby generate a plasma and direct charged precursor species from the plasma onto the substrate and etch the dielectric film. Note that the substrate itself serves as an electrode here. Its bias accelerates charged species to it. Typically, the substrate electrode is powered by a high frequency RF source.

The RIE process anisotropically etches dielectric and removes the overhang formed in the gap entry region during the deposition processing (509).

After the RIE step is complete, the reactor chamber conditions are readjusted for the second, isotropic etch step (511). In a preferred embodiment, the isotropic etch is conducted using the microwave source of a dual source reactor. The power to the RF electrodes of the reactor is turned off and an isotropic etchant chemistry is supplied to the reactor replacing the anisotropic etchant chemistry. The isotropic process gases equilibrate and the process adjusts the substrate temperature to a level promoting the microwave downstream plasma removal of dielectric from the gap sidewalls. Typically, this temperature is between about 10 and 60° C. (more preferably about 10 to 30° C., for example 20° C.). The process also adjusts the pressure of the process chamber to a level suitable for microwave downstream plasma. This pressure is generally about 1–3 Torr.

An electrical subsystem applies electrical energy of appropriate power and frequency to the microwave source of the dual source reactor. The power and frequency are chosen to generate a microwave downstream plasma in the plasma tube, given the etchant chemistry, pressure, and other process parameters.

The reactor system introduces isotropic etchant chemistry to the reaction chamber via an inlet. The etchant process gas should dissociate at a controlled rate consistent with isotropic etching and provide for uniform etching of the sidewall dielectric. An $NF_3$/He-based chemistry is typically used. Other fluorinated gases, e.g., $SF_6$ or $NF_3$ may be used. Molecular oxygen and/or one or more an inert carrier gases such as helium or Argon may also be present in the etchant chemistry. All the process gas components are introduced at specified flow rates within the parameters noted above.

The substrate is unbiased for the microwave downstream plasma process. A microwave plasma generator above the substrate generates a radical plasma that is then streamed onto the substrate.

It should be noted that the downstream isotropic etch may alternatively be accomplished by an inductively coupled plasma (ICP) etch.

The downstream plasma process isotropically etches sidewall dielectric in the gap(s) widening the remaining gap thereby decreasing its aspect ratio and facilitating is further filling in subsequent deposition processing (511).

Following the isotropic etch, the two-step dry etch back process is complete. After evacuating the chamber and adjusting pressure as appropriate, the substrate is removed from the etch back reactor and returned to a deposition reactor for further deposition processing (513). For example, the robot arm 210 removes the substrate from the plasma etch reactor 206 and transfers it to an HDP CVD reactor 204 for another round of dielectric deposition.

The etch back and deposition processes (505–513) are then repeated until the gap is filled. For a gap with about a 6:1 aspect ratio and about a 1000 Å width, three to five, for example four, iterations of the etch back and deposition steps are typical to obtain void free filling of the gap.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation (STI), inter-metal layer dielectric (ILD) layers, passivation layers, etc.

As indicated, the invention can effectively fill gaps having widths of 0.15 microns or less, for example 0.1 micron or less, and aspect ratios of 3:1 or greater, for example 5:1, 6:1, or even 10:1 or greater. More aggressive structures having, e.g., greater aspect ratios and smaller widths may also be used. In one example the gap width is 0.15 micrometers or less, e.g., between 0.13 and 0.1 micrometers.

The dielectrics employed to fill those gaps will often be a silicon oxide such as silicon dioxide, silicon oxynitride, silicon oxyfluoride, and doped variants of each of these. Therefore, the scope of the invention includes at least phosphorus-doped, boron/phosphorus-doped oxides and fluorine/phosphorus-doped oxides. As indicated, the dielectric may also be a phosphorus- and boron-doped silicon oxide glass (BPSG).

EXAMPLES

The following examples are provided to illustrate certain aspects of the present invention. The examples will serve to further illustrate the invention but are not meant to limit the scope of the invention in any way.

Example 1

Optimization of Deposition Characteristics

The deposition topography can be optimized by manipulating the S/D ratio of the deposition process. Of particular interest are bottom-up fill, uniformity of sidewall deposition, and protection of the pad nitride at the top of the gap structure. FIGS. 6A–B are plots of data illustrating optimization of the characteristics of the deposition stage of one embodiment of the present invention. Bottom-up fill can be quantified by the ratio of the sidewall (S) or maximum sidewall (C) to the bottom (B) deposition. These ratios should be minimized for maximum fill directionality. In addition, in order to protect against sidewall attack from the isotropic etch component, the uniformity of sidewall deposition should be maximized. In effect, the ratio of the maximum to minimum sidewall growth should be as close to 1 as possible. The third key topography constraint is the protection of the pad nitride that is found at the top of the structure. In addition to selectivity enhancements, the protection (P) of nitride by the oxide layer is maximized for reducing the possibility of F attack.

The deposition topography can be optimized by changing the S/D ratio of the deposition process. As the S/D ratio is decreased the bottom up fill is improved due to reduced re-deposition. Both the S/B and C/B ratios both decrease with decreasing S/D ratio. The sidewall uniformity is improved at lower S/D ratio as is evident from the C/S ratio. The protection of the pad nitride which can be quantified using the P/C ratio is also optimized at lower sputter rates. The optimum S/D ratio for the structure in question is 0.05 as can be seen from the graphs.

Figure 6A:
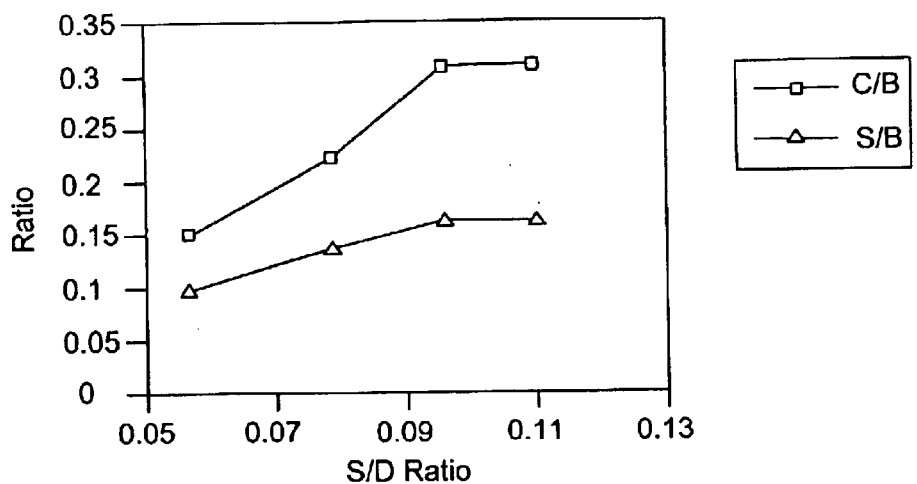
FIGS. 6A–B are plots of data illustrating optimization of the characteristics of the deposition stage of one embodiment of the present invention.
Figure 6B:
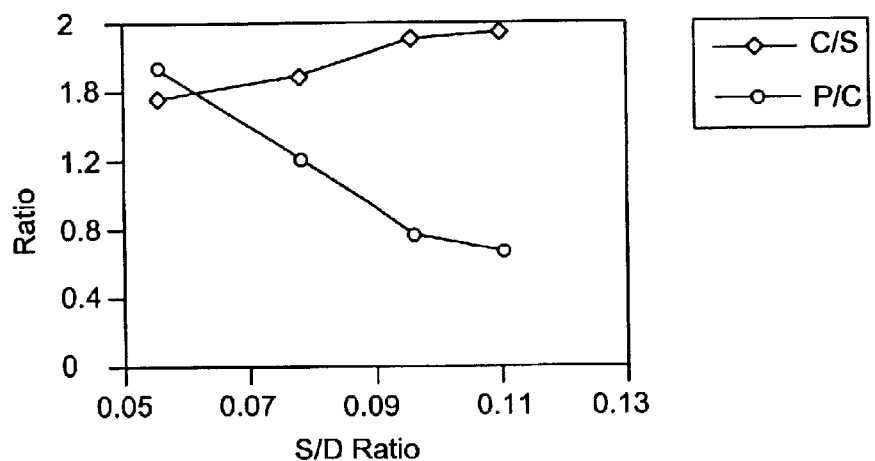
Figure 6C:
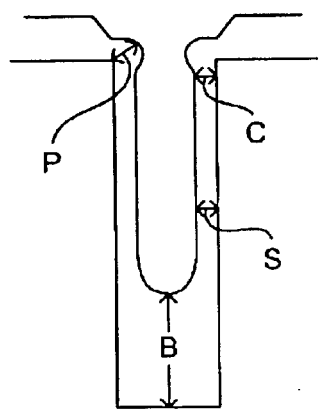
FIG. 6C is a rough schematic cross-sectional diagram of a partially filled gap illustrating the parameters used in FIGS. 6A–B.

FIG. 6C is a rough schematic cross-sectional diagram of a partially filled gap illustrating the parameters used in FIGS. 6A–B.

Example 2

Dielectric Quality

Figure 7:
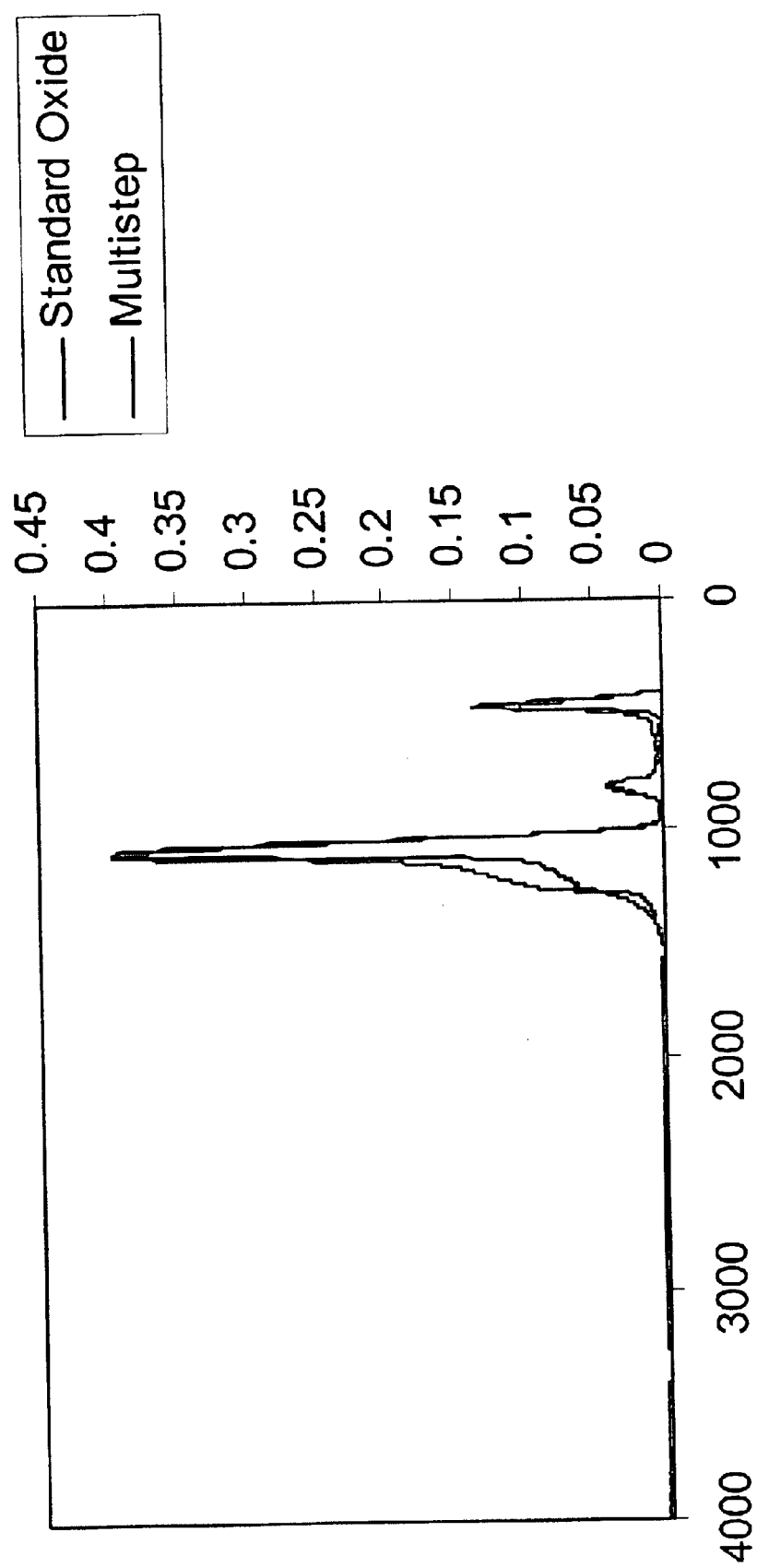
FIG. 7 presents FTIR absorption spectra for silicon oxide dielectrics deposited by a multi-step deposition and etch back process in accordance with the present invention and by conventional HDP CVD deposition.

FIG. 7 presents FTIR absorption spectra for silicon oxide dielectrics deposited by a multi-step deposition and etch back process in accordance with the present invention and by conventional HDP CVD deposition. The spectra are substantially the same and, importantly, there are no Si-F peaks visible in the spectrum for the multi-step deposition and etch back process, indicating lack of contamination by the etchant.

Example 3

Gap Fill Results Using Multi-Step Deposition and Etch Back Process

As discussed in Example 1, the deposition topography can be controlled and optimized, but the degree of optimization is dependent upon the material being deposited and other constraints. In order to successfully fill small dimensioned, high aspect ratio features, as demonstrated in FIG. 8, the etchback process must be versatile to accommodate the wide variety of deposition profiles (as represented in FIGS. 1 and 6C, and also discussed in Example 1) produced by the myriad of deposition processes used for dielectric gap fill. The two step, anisotropic/isotropic etch back process is advantageous for this reason.

For the most difficult deposition cases, where the deposition profile has a severe constriction at the top of the feature, an initial etchback process step is used to remove the material from top of the structure, thus removing the constriction at the top opening of the structure. This is done anisotropically (i.e., without removing significant amounts of material from the lower sidewalls) by biasing the substrate in the RIE etch back process step. To minimize the loss of material at the bottom of the feature, this process is carried out at significantly higher process pressures than those used for the deposition in order to reduce the penetration of the ionic etch species to the bottom of the trench. For the less difficult cases where the constriction at the top of the feature is not so severe, the process parameters may be adjusted to optimize the results—typically this is accomplished by using a shorter process time.

Once the material at the top of the feature is removed, an isotropic process is used to remove the dielectric material from the sidewalls of the feature. This process has a high selectivity to the underlying thin nitride liner to prevent inadvertant punch-through of this layer to the underlying material. The use of an isotropic process affords this chemical selectivity and uniform etching of the deposited material surfaces, thus enlarging the dimensions of the trench (i.e. reducing the aspect ratio) to facilitate the efficient filling of the feature in the next deposition step.

Figure 8:
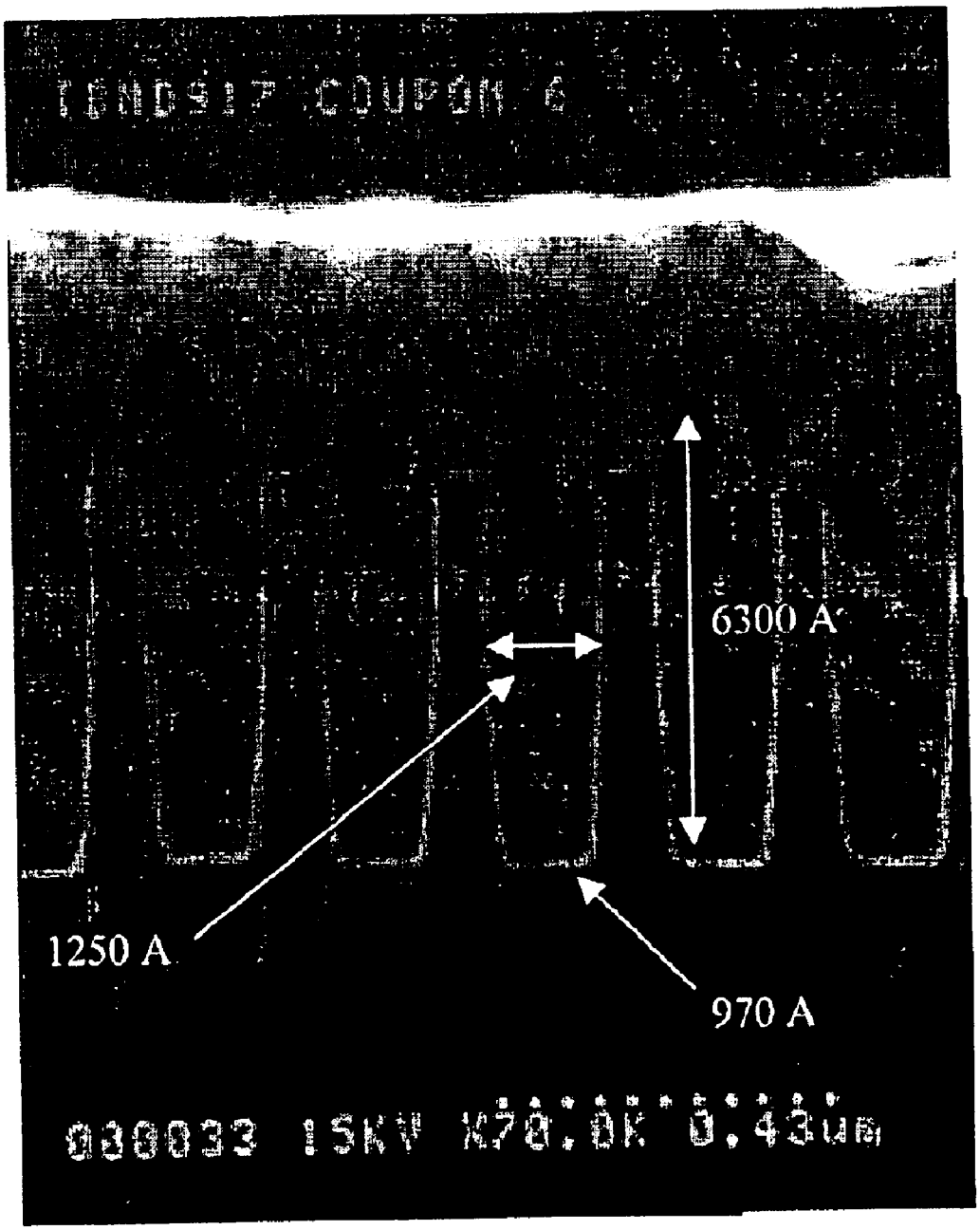
FIG. 8 is an electron micrograph depicting a cross-sectional view of trenches filled in accordance with the present invention.

FIG. 8 is an electron micrograph depicting a cross-sectional view of trenches filled in accordance with the present invention. Void free gap fill was achieved for these very high aspect ratio narrow trenches.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a semiconductor substrate, the method comprising:
   (a) partially filling a gap on a semiconductor substrate with a dielectric using a high density plasma chemical vapor deposition process;
   (b) partially removing dielectric deposited in the gap from the gap opening and sidewalls by a multi-step etch back process comprising an anisotropic dry etch followed by an isotropic dry etch; and
   (c) further filling of the partially filled gap by a high density plasma chemical vapor deposition process.

2. The method of claim 1, wherein (b) and (c) are repeated until the gap is filled.

3. The method of claim 1, wherein (b) comprises a reactive ion etch followed by a downstream plasma etch.

4. The method of claim 1, wherein the deposition process uses a process gas comprising a silicon-bearing compound selected from the group of $SiH_4$, $SiF_4$, $Si_2H_6$, TEOS, TMCTS, OMCTS, methyl-silane, dimethyl-silane, 3MS, 4MS, TMDSO, TMDDSO, DMDMS and mixtures thereof, said process further comprising decomposing the silicon-containing compound to allow plasma phase reacting of a silicon-containing reactant on the surface of the substrate.

5. The method of claim 4 wherein the processing gas further comprises a reactant selected from the group consisting of $N_2$, $N_2O$, NO, $NH_3$, $NF_3$, $O_2$, and mixtures thereof.

6. The method of claim 5, wherein the process gas comprises a reactant selected from the group of boron-containing gas, phosphorus-containing gas, and mixtures thereof.

7. The method of claim 1, wherein the deposition is conducted in a high density plasma chemical vapor deposition process chamber.

8. The method of claim 7, wherein the deposition reactor process chamber is maintained at a pressure of not more than about 100 mTorr.

9. The method of claim 7, wherein the high density plasma chemical vapor deposition reactor comprises an electrode that generates a plasma from the process gas.

10. The method of claim 7, wherein the bias applied to the substrate is a radio frequency bias.

11. The method of claim 7, wherein the substrate is placed on a substrate holder that is maintained at a temperature of between about 30 and 1000° C.

12. The method of claim 7, further comprising clamping the substrate on an electrostatic or mechanical chuck in the deposition chamber during the film growing.

13. The method of claim 1, further comprising plasma reacting at least one of an oxygen-containing gas and a hydrogen-containing gas on the substrate surface and removing polymer residues from the substrate surface prior to the film growing.

14. The method of claim 1, wherein the dielectric comprises a silicon oxide.

15. The method of claim 1, wherein the dielectric comprises $SiO_2$.

16. The method of claim 1, wherein the dielectric comprises silicon oxyfluoride.

17. The method of claim 1, wherein the dielectric comprises silicon oxynitride.

18. The method of claim 1, wherein the dielectric comprises phosphorus-doped silicon oxide.

19. The method of claim 1, wherein the dielectric comprises boron-doped silicon oxide.

20. The method of claim 1, wherein the dielectric comprises phosphorus- and boron-doped silicon oxide (BPSG).

21. The method of claim 1, wherein the dielectric comprises carbon-doped silicon oxide.

22. The method of claim 4, wherein the deposition process uses a process gas comprising hydrogen as a carrier.

23. The method of claim 4, wherein the deposition process uses a process gas further comprising an inert carrier gas.

24. The method of claim 4, the deposition process uses a process gas comprising only an inert carrier gas.

25. The method of claim 1, wherein the dry etch back steps are conducted in a dual source plasma reactor process chamber.

26. The method of clam 25, wherein the dual source reactor process chamber comprises RF and downstream plasma sources.

27. The method of claim 26, wherein the RF source is used to generate a plasma for the anisotropic etch in the reactor process chamber.

28. The method of claim 26, wherein the anisotropic etch is a reactive ion etch.

29. The method of claim 26, wherein the downstream source is selected from the group consisting of a microwave source and an inductively coupled plasma source.

30. The method of claim 29, wherein a microwave source is used to generate a microwave down plasma for the isotopic etch in the reactor process chamber.

31. The method of claim 29, wherein an inductively coupled plasma source is used to generate a downstream plasma for the isotropic etch in the reactor process chamber.

32. The method of claim 26, wherein the dual source reactor process chamber is maintained at a pressure of about 200–800 mTorr for the anisotropic etch.

33. The method of claim 26, wherein the dual source reactor process chamber is maintained at a pressure of about 1–3 Torr for the isotropic etch.

34. The method of claim 26, wherein the substrate is placed on a substrate holder that is maintained at a temperature of between about 10 and 30° C.

35. The method of claim 26, further comprising clamping the substrate on an electrostatic or mechanical chuck in the reactor chamber during the etch back processing.

36. The method of claim 28, wherein the reactive ion etch plasma chemistry comprises a F-containing compound selected from the group consisting of $CF_4$, $C_2F_6$, $CHF_3$, $NF_3$ and $SF_6$ and an inert gas selected from the group consisting of He, Ar and $N_2$.

37. The method of claim 30, wherein the microwave downstream plasma chemistry comprises a F-containing compound selected from the group consisting of $NF_3$, $C_2F_6$, $CF_4$ and $SF_6$ and an inert gas selected from the group consisting of He, Ar and $N_2$.

38. The method of claim 30, wherein the isotopic etch is selective to the dielectric relative to an underlying gap liner.

39. The method of claim 38, wherein the dielectric is silicon dioxide, the gap liner is silicon nitride and the isotropic etch selectivity is as high as 1.4:1.

40. The method of claim 1, wherein the deposition and etch back steps are conducted in a single plasma processing device with multiple reactor chambers.

41. The method of claim 40, wherein the device comprises:
two deposition chambers;
a dual source eth back chamber, and
a transfer module equipped with apparatus for transferring wafers between the chambers in a controlled environment.

42. The method of claim 41, wherein the device achieves a throughput of greater than 10 wafers per hours.

43. The method of claim 42, wherein the device achieves a throughput of about 15–16 wafers per hour.

44. The method of claim 1, wherein the deposition and etch back steps are conducted in a single chamber.

45. The method of claim 1, wherein the deposition is conducted using an S/D ratio of about 0.05.

46. The method of claim 1, wherein the deposition is conducted using process chemistry and conditions as follows: about 40 sccm He, about 40 sccm $SiH_4$, about 75 sccm $O_2$, and about 1000 sccm $H_2$, a low frequency electrode power of about 2500 W, and a high frequency electrode power of about 1200 W.

47. The method of claim 36, wherein the reactive ion etch plasma chemistry comprises $CF_4$ and He.

48. The method of claim 37, wherein the microwave downstream plasma chemistry comprises $NF_3$ and He.

49. The method of claim 1, wherein the anisotropic etch is conducted using RIE process chemistry and conditions as follows:

| | |
|---|---|
| Platen temp (° C.) | 20 |
| $CF_4$ (sccm) | 50 |
| He (sccm) | 150 |
| Pressure (mTorr) | 200–220 |
| RF Power (W) | 450. |

50. The method of claim 1, wherein the isotropic etch is conducted using microwave downstream plasma process chemistry and conditions as follows:

| | |
|---|---|
| Platen temp (° C.) | 20 |
| $NF_3$ (sccm) | 750 |
| He (sccm) | 1250 |
| Pressure (Torr) | 2 |
| MW Power (W) | 1700. |

51. A method of cleaning a partially filled gap on a semiconductor substrate, the method comprising:
partially removing dielectric deposited in the gap form the gap opening and sidewalls by a multi-step etch back process comprising an anisotropic dry etch followed by an isotropic dry etch; and
depositing additional dielectric in the cleaned, partially-filled gap using a high density plasma chemical vapor deposition process.

52. The method of claim 51, wherein the multi-step etch back process comprises a reactive ion etch (RIE) followed by microwave downstream plasma etch.

53. The method of claim 51, wherein the anisotropic etch is conducted using RIE process chemistry and conditions as follows:

| | |
|---|---|
| Platen temp (° C.) | 20 |
| $CF_4$ (sccm) | 50 |
| He (sccm) | 150 |
| Pressure (mTorr) | 200–220 |
| RF Power (W) | 450. |

54. The method of claim 51, wherein the isotropic etch is conducted using microwave downstream plasma process chemistry and conditions as follows:

| | |
|---|---|
| Platen temp (° C.) | 20 |
| $NF_3$ (sccm) | 750 |
| He (sccm) | 1250 |
| Pressure (Torr) | 2 |
| MW Power (W) | 1700. |

55. The method of claim 1, wherein the deposition is conducted such that the gap sidewall to bottom fill ratio is minimized and the sidewall deposition uniformity is maximized.

56. The method of claim 1, wherein the gap comprises a nitride liner and the isotropic etch is conducted with a nitride selective chemistry to avoid damaging the nitride liner.

* * * * *